(12) United States Patent
Qiu et al.

(10) Patent No.: US 11,864,342 B2
(45) Date of Patent: Jan. 2, 2024

(54) FAN MODULE AND CASE INCLUDING THE SAME

(71) Applicant: Celestica Technology Consultancy (Shanghai) Co. Ltd, Shanghai (CN)

(72) Inventors: Jinbin Qiu, Shanghai (CN); Yuan Xue, Shanghai (CN)

(73) Assignee: Celestica Technology Consultancy (Shanghai) Co. Ltd, Shanghai (CN)

( * ) Notice: Subject to any disclaimer, the term of this patent is extended or adjusted under 35 U.S.C. 154(b) by 0 days.

(21) Appl. No.: 17/711,010

(22) Filed: Mar. 31, 2022

(65) Prior Publication Data
US 2023/0037300 A1    Feb. 9, 2023

(30) Foreign Application Priority Data

Jul. 27, 2021  (CN) .......................... 202110852570.3
Jul. 27, 2021  (CN) .......................... 202121723312.7

(51) Int. Cl.
*H05K 7/20*           (2006.01)

(52) U.S. Cl.
CPC ..... *H05K 7/20172* (2013.01); *H05K 7/20727* (2013.01)

(58) Field of Classification Search
CPC ...................... H05K 7/20172; H05K 7/20727
See application file for complete search history.

(56) References Cited

U.S. PATENT DOCUMENTS

2021/0368981 A1* 12/2021 Jhou .................. H05K 7/14

* cited by examiner

*Primary Examiner* — Mukundbhai G Patel

(57) ABSTRACT

The present disclosure provides a fan module and a case including the fan module. The fan module includes a fan, a fan bracket and a traction structure. The fan bracket includes: a fixed bottom plate for carrying and fixing the fan; and a connection structure, connected to the fixed bottom plate and used for being connected to a case through plugging. The traction structure is mounted on the fan bracket, and is used for pulling the fan bracket from the inside of the case to the outside of the case. In the present disclosure, the fan module is plugged into the case, and is pulled to the outside of the case from the inside of the case through a traction interface. In this way, the fan maintenance is implemented without disassembling the case or cutting off the power, the maintenance efficiency is improved, and the maintenance cost is reduced.

9 Claims, 4 Drawing Sheets

FAN MODULE AND CASE INCLUDING THE SAME

CROSS REFERENCE TO RELATED APPLICATION

The present application claims the benefit of priority to Chinese Patent Application No. 2021108525703, entitled "Fan Module and Case Including the Same", filed with CNIPA on Jul. 27, 2021, and Chinese Patent Application No. 2021217233127, entitled "Fan Module and Case Including the Same", filed with CNIPA on Jul. 27, 2021, the content of which is incorporated herein by reference in their entireties.

FIELD OF DISCLOSURE

The present disclosure relates to the technical field of servers, and in particular, to the technical field of server cases.

BACKGROUND

Today, a server is required to have increasingly higher performance, resulting in a higher server density, more extension interfaces, and a sharp increase in power consumption of the server. End clients are highly concerned about the reliability and maintainability of a fan. In fact, during designing, to meet functional requirements of clients is the priority of many server manufacturers. Therefore, a front panel and a rear panel of the server are all provided with external interfaces, which makes it impossible to hot-plug a fan without disassembling a case. When a fan of the server is broken, the case needs to be disassembled to replace the fan. However, some servers are disposed on a rack in a computer room, so the server needs to be disassembled from the rack for maintenance, which greatly increases the maintenance labor cost. In addition, because the server needs to be disassembled, the server needs to be shut down. In this case, the fan maintenance cannot be implemented under working condition, which causes the service of the server to stop and reduces the utilization and reliability of the server.

SUMMARY

The present disclosure provides a fan module and a case including the fan module, to resolve the technical problem that the case needs to be disassembled during replacement of the fan of the case in the related art.

The present disclosure provides a fan module, including: a fan, a fan bracket and a traction structure. The fan bracket includes a fixed bottom plate and a connection structure. The fixed bottom plate carries and fixes the fan. The connection structure is connected to the fixed bottom plate and is connected to a case through plugging. The traction structure is mounted on the fan bracket, and pulls the fan bracket from the inside of the case to the outside of the case.

In an embodiment of the present disclosure, the connection structure includes a connection plate, a first support plate and a second support plate. A surface of the connection plate includes a first plug portion for matching with a second plug portion in the case to plug the connection structure into the case. The first support plate and the second support plate are respectively connected to two sides of the connection plate and located below the connection plate.

In an embodiment of the present disclosure, the first plug portion is a groove arranged in a plugging direction of the connection structure and the case; the second plug portion in the case is a slide rail; and a width of an accommodating cavity formed by the groove inside the connection plate is greater than a width of an opening formed on the surface of the connection plate by the groove, so that when the slide rail is inserted into the groove, the connection structure is fixed with the case.

In an embodiment of the present disclosure, a starting end of the groove is a first plate end of the connection plate corresponding to the fan, and the groove extends toward a second plate end of the connection plate in the plugging direction of the connection structure and the case, and is terminated at a terminal end of the connection plate close to the second plate end.

In an embodiment of the present disclosure, the terminal end includes a limiting structure for restricting continued movement of the slide rail.

In an embodiment of the present disclosure, a length of the first support plate and a length of the second support plate match a length of the fan.

In an embodiment of the present disclosure, the traction structure comprises a rotating shaft fixed on a second plate end of the connection plate and a pulling handle connected to the rotating shaft and rotatable relative to the rotating shaft.

The present disclosure further provides a case. The case includes: a plurality of fan modules as described above; when the plurality of fan modules is mounted in the case, the fan in each of the plurality of fan modules is correspondingly connected to a backplane in the case; and at least one interface module, disposed at a rear end of the case through plugging, and located on an outer side of the plurality of fan modules when the plurality of fan modules is placed in the case.

In an embodiment of the present disclosure, a bottom surface of a top cover plate of the case includes a second plug portion, and a first plug portion of a connection plate in the plurality of fan modules is matched with and plugged into a second plug portion of the top cover plate of the case.

In an embodiment of the present disclosure, a rear end of the case comprises a top layer region and a bottom layer region divided by a partition; two interface modules are respectively located in the top layer region and the bottom layer region; the plurality of fan modules is disposed in the top layer region and the bottom layer region; and a bottom surface of a top cover plate of the case and a bottom surface of the partition are respectively provided with second plug portions, the fan modules in the top region are correspondingly plugged into the top cover plate of the case, and the fan modules in the bottom region are correspondingly plugged into the partition.

As described above, the fan module of the present disclosure and the case including the fan module have the following beneficial effects:

In the present disclosure, the fan module is plugged into the case, and is pulled to the outside of the case from the inside of the case through a traction interface. In this way, the fan maintenance is implemented without disassembling the case or cutting off the power, the maintenance efficiency is improved, and the maintenance cost is reduced, thereby effectively resolving the technical problem that the case needs to be disassembled during replacement the fan of the case in the related art. In addition, the present disclosure has simple structure and convenient installation operation, and does not need to occupy much internal space of the server.

Figure 1:
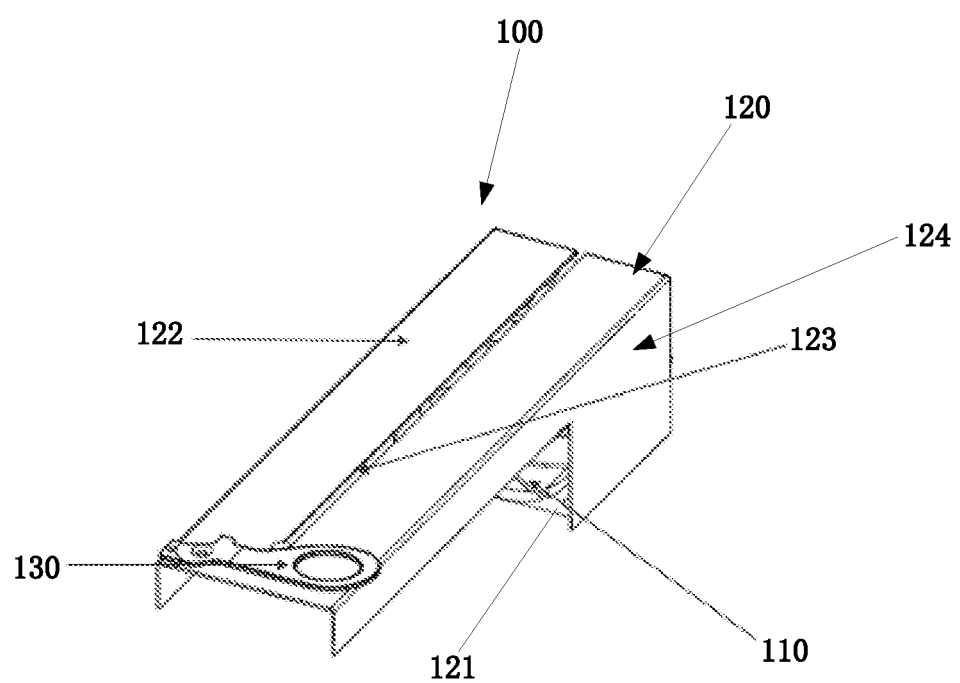
FIGS. 1 and 2 are schematic diagrams showing an overall structure of a fan module according to the present disclosure.

| Description of Reference Numerals of Elements | |
|---|---|
| 100 | Fan module |
| 110 | Fan |
| 120 | Fan bracket |
| 121 | Fixed bottom plate |
| 122 | Connection plate |
| 123 | Groove |
| 124 | support plate |
| 130 | Traction structure |
| 200 | Case |
| 210 | Interface module |

DETAILED DESCRIPTION OF THE PREFERRED EMBODIMENTS

The following describes implementations of the present disclosure by using specific embodiments. A person skilled in the art may easily understand other advantages and effects of the present disclosure from the content disclosed in this specification.

Refer to FIGS. 1 to 4. It should be noted that the structures, proportions, sizes, and the like shown in the drawings of the specification, in coordination with the content disclosed in the specification, are only used to help a person skilled in the art to read and understand, and they are not intended to limit the conditions under which the present disclosure can be implemented and therefore have no technical significance. Any modifications to the structure, changes to the proportional relationship or the adjustment on the size should fall within the scope of the technical content disclosed by the present disclosure without affecting the effects and the objectives that can be achieved by the present disclosure. In addition, the terms such as "top", "bottom", "left", "right", "middle", and "a" mentioned in this specification are also merely for facilitating clear descriptions, but are not intended to limit the scope of implementation of the present disclosure. Without substantially changing the technical contents, changes or adjustments of relative relationships thereof should also fall within the scope of implementation of the present disclosure.

This embodiment provides a fan module and a case including the fan module, to resolve the technical problem that the case needs to be disassembled during replacement of a fan of the case in the related art.

A principle and an implementation of a fan module and a case including the fan module of this embodiment are described in detail below, so that a person skilled in the art can understand the fan module of this embodiment and the case including the fan module.

Embodiment 1

Figure 2:
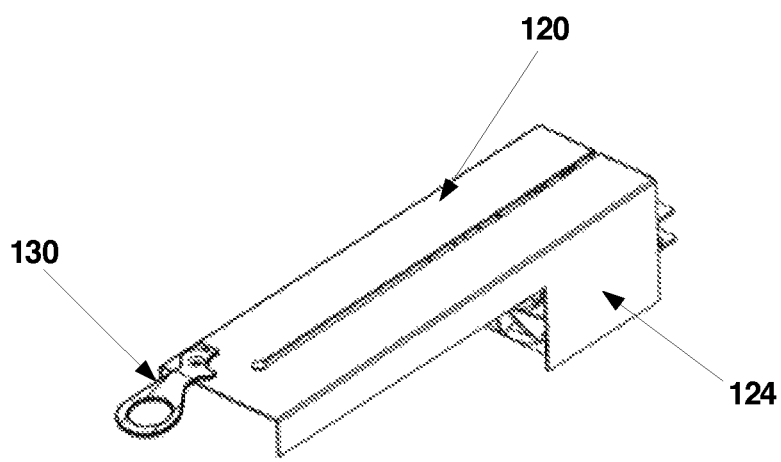

As shown in FIGS. 1 and 2, this embodiment provides a fan module 100. The fan module 100 includes: a fan 110, a fan bracket 120 and a traction structure 130.

Figure 3:
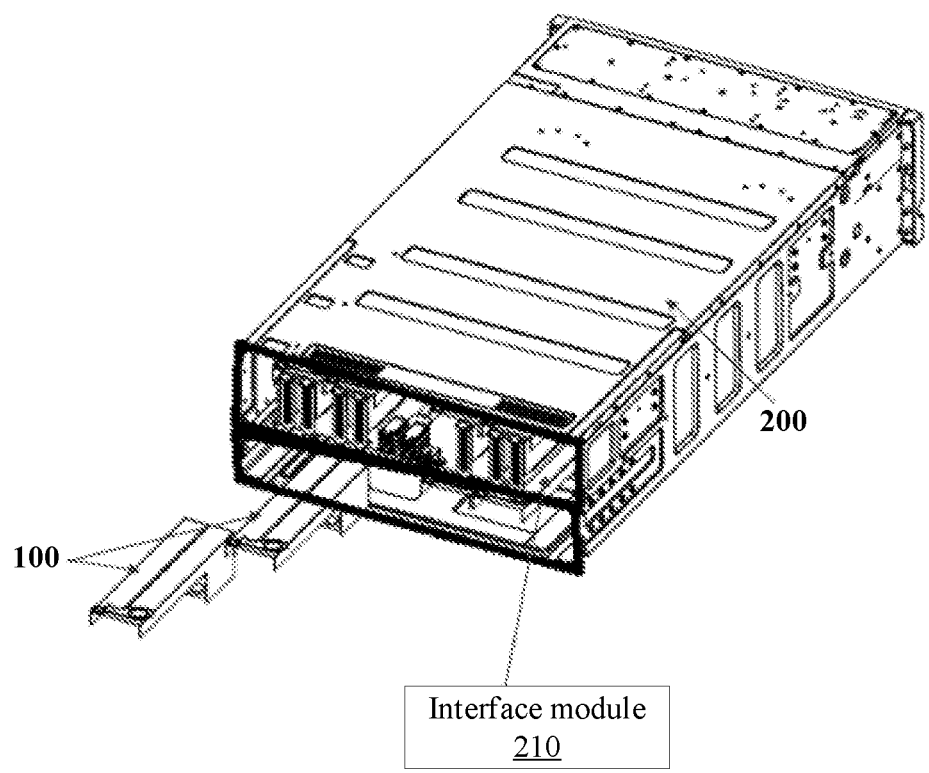
FIGS. 3 and 4 are schematic diagrams showing a matching connection between a case and a fan module according to the present disclosure.
Figure 4:
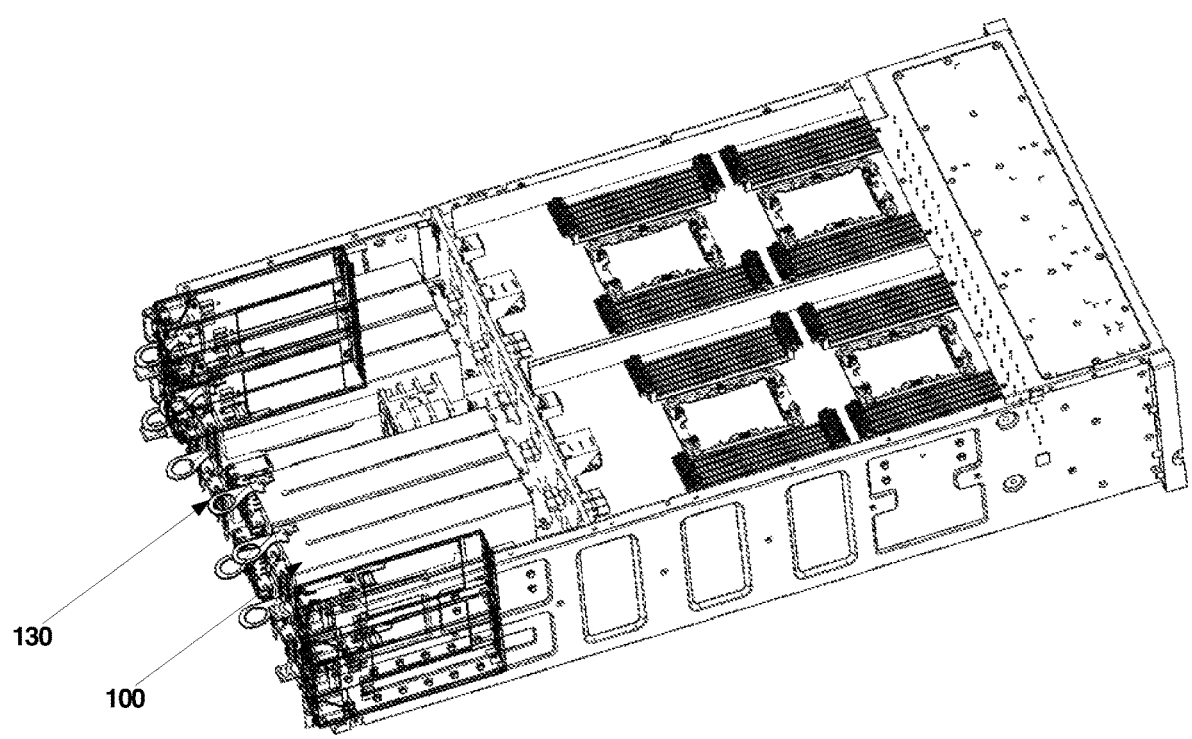

The fan 110 is mounted in the fan bracket 120. As shown in FIGS. 3 and 4, after the fan bracket 120 and the fan 110 are mounted in the case 200 as a whole module, the fan bracket 120 is pulled out from the case 200 through the traction structure 130 disposed on the fan bracket 120. In this way, the maintenance of the fan 110 is implemented without disassembling the case 200 or cutting off the power, the maintenance efficiency is improved, and the maintenance cost is reduced, thereby effectively resolving the technical problem that the case 200 needs to be disassembled during replacement of the fan 110 of the case 200 in the related art.

The fan 110, the fan bracket 120 and the traction structure 130 in the fan module 100 in this embodiment are described in detail below.

In this embodiment, the fan module 100 is mounted in the case 200, and is used for providing air flow to the case 200 for heat dissipation.

In this embodiment, the case 200 is but not limited to a 2U height standard case or a 4U height standard case. "U" is a unit representing external dimensions of the case 100, which is an abbreviation for Unit, and detailed dimensions are determined by the Electronic Industries Association (EIA), which is an industry group. Dimensions of case 200 are specified so that a case keeps a proper size to fit on an iron or aluminum rack. Screw holes are disposed on the rack for fixing the case. The screw holes on the rack are aligned with screw holes of the case and fixed by screws. The specified dimensions are a width (48.26 cm=19 inches) and a height (a multiple of 4.445 cm) of the case. 1U is 4.445 cm, 2U is twice 1U and is 8.89 cm, and 4U is twice 2U and is 17.8 cm.

In this embodiment, the fan 110 is, but is not limited to, a standard turbo fan. The fan 110 is mounted in the fan bracket 120 to form a whole module. The fan bracket 120 is inserted into and fixed in the case 200. When the fan 110 is broken and the fan module 100 needs to be pulled out from the case 200, the fan bracket 120 is pulled out from the case 200.

Specifically, as shown in FIG. 1, the fan bracket 120 includes: a fixed bottom plate 121 and a connection structure.

In this embodiment, the fixed bottom plate 121 carries and fixes the fan 110. That is, the fan 110 is placed on the fixed bottom plate 121 and fixed on the fixed bottom plate 121, and a fixing manner is not limited. The fan 110 is fixed on the fixed bottom plate 121, so that the fan 110 is inserted into or removed from the case 200 together with the fan bracket 120.

In this embodiment, the connection structure is connected to the fixed bottom plate 121 and is connected to the case 200 through plugging.

The connection structure and the fixed bottom plate 121 are integrally formed, or are fixedly connected by welding or the like.

Specifically, in this embodiment, the connection structure includes: a connection plate 122 and support plates 124 that are located on both sides of the connection plate 122 and correspond to the fan 110.

In this embodiment, a first plug portion is provided on a surface of the connection plate 122, and matches with a second plug portion in the case 200 to plug the connection structure into the case 200, thereby fixing the fan module 100 on the case 200.

Further, in this embodiment, the first plug portion is a groove 123 disposed in a plugging direction of the connection structure and the case 200; a second plug portion in the case 200 is a slide rail. That is, in this embodiment, the fan 110 is fixed by the fan bracket 120, and the fan bracket 120 is provided with the groove 123 to provide guidance for mounting the fan bracket 120 onto the case 200.

Specifically, a width of an accommodating cavity formed by the groove 123 inside the connection plate 122 is greater than a width of an opening formed on the surface of the connection plate 122 by the groove 123, so that when the slide rail is inserted into the groove 123, the connection structure is fixed with the case 200.

A slide rail is disposed on a surface of a case plate of the case 200 close to the groove 123 in the fan bracket 120, so that the fan bracket 120 is inserted into and fixed on the case plate of the case 200. The case plate includes, but is not limited to, a top cover plate of the case 200, a middle partition, or the like. That is, in this embodiment, the fan module 100 is inserted into the case 200 through the slide rail on the top cover plate of the case 200.

In this embodiment, a starting end of the groove 123 is a first plate end of the connection plate 122 corresponding to the fan 110, and the groove 123 extends toward a second plate end of the connection plate 122 in the plugging direction of the connection structure and the case 200, and is terminated at a terminal end of the connection plate 122 close to the second plate end.

That is, in this embodiment, the groove 123 extends from one end of the surface of the connection plate 122 to be close to the other end, but does not extend all the way to the other end of the surface of the connection plate 122.

In this embodiment, the terminal end is provided with a limiting structure for restricting continued movement of the slide rail. In this way, when the slide rail in the case 200 slides into the groove 123 on the surface of the connection plate 122, as the fan module 100 is continuously pushed into the case 200, the slide rail continuously slides forward into the groove 123 along the groove 123, and is limited by a limiting structure at the terminal end of the groove 123.

In this embodiment, the support plate 124 includes a first support plate 124 and a second support plate 124 respectively connected to two sides of the connection plate 122 and located below the connection plate 122. The connection plate 122, the first support plate 124 and the second support plate 124 are preferably integrally formed, or fixedly connected by welding or the like.

In this embodiment, a length of the first support plate 124 and a length of the second support plate 124 are respectively matched with a length (height) of the fan 110. In this way, the first support plate 124, the second support plate 124, and the fixed bottom plate 121 carrying and fixing the fan 110 cover the fan 110 to prevent the fan module 100 from colliding with the fan 110 when the fan module 100 is inserted into and pulled out of the case 200.

In this embodiment, the traction structure 130 is mounted on the fan bracket 120, and pulls the fan bracket 120 from the inside of the case 200 to the outside of the case 200.

Specifically, in this embodiment, the traction structure 130 includes a rotating shaft fixed on a second plate end of the connection plate 122 and a pulling handle connected to the rotating shaft and rotatable relative to the rotating shaft.

The pulling handle is used for the user to pull out the fan module 100 from the inside of the case 200, and is pressed into the case 200 when not in use.

That is, when the traction structure 130 is not in use, the pulling handle is rotated and placed on the surface of the connection plate 122. When the fan module 100 needs to be pulled out of the case 200, the traction structure 130 is rotated to be separated from the surface of the connection plate 122, and the fan bracket 120 is pulled out from the case 200 by pulling the pulling handle by hand.

In this embodiment, the fan module 100 is plugged into the case 200, and is pulled to the outside of the case 200 from the inside of the case 200 through a traction interface. In this way, the maintenance of the fan 110 is implemented without disassembling the case 200 or cutting off the power, the maintenance efficiency is improved, and the maintenance cost is reduced, thereby effectively resolving the technical problem that the case 200 needs to be disassembled during replacement of the fan 110 of the case 200 in the related art. In addition, the present disclosure has simple structure and convenient installation operation, and does not need to occupy much internal space of the server.

Embodiment 2

As shown in FIGS. 3 and 4, in this embodiment, a case 200 is provided. The case 200 includes a plurality of fan modules 100 as described in Embodiment 1, a specific structure and usage of the fan module 100 are described in detail in Embodiment 1, and are not repeated herein.

In this embodiment, when each of the fan modules 100 is mounted in the case 200, fans 110 in the fan modules 100 are correspondingly connected to a backplane in the case 200.

In this embodiment, the case 200 is provided with at least one interface module 210 in a rear region where the fan module 100 is mounted. The interface module 210 is disposed at a rear end of the case 200 through plugging, and is located on an outer side of the fan module 100 when the fan module 100 is placed in the case 200. The interface module 210 and the fan module 100 are separated from each other without connection.

That is, during mounting of the fan module 100, the interface module 210 on the outer side is first pulled out from the case 200 as a whole, then the fan module 100 is inserted into the case 200, and finally the interface module 210 is mounted in the case 200. When the fan module 100 in the case 200 needs to be replaced, the interface module 210 on the outer side is pulled out from the case 200 as a whole, and then the fan 110 is pulled out from the case 200 by pulling the pulling handle.

Specifically, in this embodiment, a bottom surface of a top cover plate of the case 200 is provided with a second plug portion, and a first plug portion of a connection plate 122 in the fan module 100 is matched with and plugged into a second plug portion of the top cover plate of the case 200.

In this embodiment, a rear end of the case 200 includes a top layer region and a bottom layer region divided by a partition; two interface modules 210 are provided and respectively located in the top layer region and the bottom layer region; and a plurality of the fan modules 100 is disposed in the top layer region and the bottom layer region.

A bottom surface of the top cover plate of the case 200 and a bottom surface of the partition are respectively provided with second plug portions. The fan modules 100 in the top region are correspondingly plugged into the top cover plate of the case 200, and the fan modules 100 in the bottom region are correspondingly plugged into the partition.

The interface module 210 is an extension module of the server and provides functional interface extension. The entire interface module 210 is inserted into the case 200 or pulled out of the case 200 as a whole.

After the fan 110 in the case 200 of the server is broken, a maintenance process of the hot-plugging of the fan 110 of the case 200 in this embodiment is as follows:

1) First, the interface module 210 is pulled out from the rear end of the case 200, while the fan module 100 is still in the case 200 at this time (the interface module 210 and the fan module 100 are separated).
2) After the broken fan module 100 is pulled out from the case 200, a new fan module 100 is inserted into the case 200, so that the new fan module 100 works.

3) After replacement of the fan module 100 is completed, the interface module 210 is inserted into the server, and the interface module 210 continues to work.

In this way, an entire maintenance process of the fan 110 is completed, and in the entire maintenance process, the server is not powered off, and the case is not disassembled, thereby improving the maintenance efficiency and reducing the maintenance cost.

In summary, in the present disclosure, the fan module is plugged into the case, and is pulled to the outside of the case from the inside of the case through a traction interface. In this way, the fan maintenance is implemented without disassembling the case or cutting off the power, the maintenance efficiency is improved, and the maintenance cost is reduced, thereby effectively resolving the technical problem that the case needs to be disassembled during replacement of the fan of the case in the related art. In addition, the present disclosure has simple structure and convenient installation operation, and does not need to occupy much internal space of the server. Therefore, the present disclosure effectively overcomes various defects in the related art, and has a high value in industrial use.

The foregoing embodiments merely exemplify the principles and effects of the present disclosure, but are not intended to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A fan module, comprising:
a fan;
a fan bracket, comprising:
   a fixed bottom plate, configured to carry and fix the fan, and
   a connection structure, connected to the fixed bottom plate and configured to be connected to a case through plugging, wherein the connection structure comprises a connection plate; and
a traction structure, mounted on the fan bracket and configured to pull the fan bracket from the inside of the case to the outside of the case, wherein the traction structure comprises a rotating shaft fixed on a second plate end of the connection plate and a pulling handle connected to the rotating shaft and rotatable relative to the rotating shaft.

2. The fan module as in claim 1, wherein the connection structure comprises:
the connection plate, wherein a surface of the connection plate includes a first plug portion for matching with a second plug portion in the case to plug the connection structure into the case; and
a first support plate and a second support plate, respectively connected to two sides of the connection plate and located below the connection plate.

3. The fan module as in claim 2, wherein the first plug portion is a groove arranged in a plugging direction of the connection structure and the case; the second plug portion in the case is a slide rail; and a width of an accommodating cavity formed by the groove inside the connection plate is greater than a width of an opening formed on the surface of the connection plate by the groove, so that when the slide rail is inserted into the groove, the connection structure is fixed with the case.

4. The fan module as in claim 3, wherein a starting end of the groove is a first plate end of the connection plate corresponding to the fan, and the groove extends toward the second plate end of the connection plate in the plugging direction of the connection structure and the case, and is terminated at a terminal end of the connection plate close to the second plate end.

5. The fan module as in claim 4, wherein the terminal end includes a limiting structure for restricting continued movement of the slide rail.

6. The fan module as in claim 2, wherein a length of the first support plate and a length of the second support plate match a length of the fan.

7. A case, comprising:
a plurality of fan modules, wherein each of the plurality of fan modules includes:
   a fan;
   a fan bracket, comprising:
      a fixed bottom plate, configured to carry and fix the fan, and
      a connection structure, connected to the fixed bottom plate and configured to be connected to a case through plugging, wherein the connection structure comprises a connection plate; and
   a traction structure, mounted on the fan bracket and configured to pull the fan bracket from the inside of the case to the outside of the case, wherein the traction structure comprises a rotating shaft fixed on a second plate end of the connection plate and a pulling handle connected to the rotating shaft and rotatable relative to the rotating shaft;
wherein when the plurality of fan modules is mounted in the case, the fan in each of the plurality of fan modules is correspondingly connected to a backplane in the case; and
at least one interface module, disposed at a rear end of the case through plugging, and located on an outer side of the plurality of fan modules when the plurality of fan modules is placed in the case.

8. The case as in claim 7, wherein a bottom surface of a top cover plate of the case includes a second plug portion, and a first plug portion of a connection plate in the plurality of fan modules is matched with and plugged into a second plug portion of the top cover plate of the case.

9. The case as in claim 7, wherein a rear end of the case comprises a top layer region and a bottom layer region divided by a partition; two interface modules are respectively located in the top layer region and the bottom layer region; and the plurality of fan modules is disposed in the top region and the bottom region, wherein a bottom surface of a top cover plate of the case and a bottom surface of the partition are respectively provided with second plug portions, the fan modules in the top region are correspondingly plugged into the top cover plate of the case, and the fan modules in the bottom region are correspondingly plugged into the partition.

* * * * *